United States Patent
Glatfelter et al.

[11] Patent Number: 6,011,215
[45] Date of Patent: Jan. 4, 2000

[54] POINT CONTACT PHOTOVOLTAIC MODULE AND METHOD FOR ITS MANUFACTURE

[75] Inventors: Troy Glatfelter, Royal Oak; Eric Akkashian, Ferndale; Mark Lycette, Berkley, all of Mich.

[73] Assignee: United Solar Systems Corporation, Troy, Mich.

[21] Appl. No.: 08/993,064

[22] Filed: Dec. 18, 1997

[51] Int. Cl.[7] .................................................. H01L 31/042
[52] U.S. Cl. .......................... 136/249; 136/244; 136/256; 136/258; 136/246; 136/251; 257/431; 257/448; 257/459; 257/433; 438/73; 438/74; 438/98; 438/83; 438/89; 438/64
[58] Field of Search ........................... 136/249 MS, 244, 136/256, 258 AM, 246, 251; 257/431, 448, 459, 433; 438/73, 74, 98, 83, 89, 64

[56] References Cited

U.S. PATENT DOCUMENTS

| | | | |
|---|---|---|---|
| 4,532,371 | 7/1985 | Hanak et al. | 136/249 |
| 4,650,524 | 3/1987 | Kiyama et al. | 148/1.5 |
| 4,668,840 | 5/1987 | Kiyama et al. | 136/244 |
| 4,726,849 | 2/1988 | Murata et al. | 136/244 |
| 4,773,943 | 9/1988 | Yamaguchi et al. | 136/244 |
| 4,808,242 | 2/1989 | Murata et al. | 136/244 |
| 4,849,029 | 7/1989 | Delahoy | 136/249 |
| 4,865,999 | 9/1989 | Xi et al. | 437/2 |
| 4,956,023 | 9/1990 | Tsuge et al. | 136/244 |
| 5,131,954 | 7/1992 | Vogeli et al. | 136/244 |
| 5,268,037 | 12/1993 | Glatfelter | 136/249 |
| 5,468,988 | 11/1995 | Glatfelter et al. | 257/431 |

FOREIGN PATENT DOCUMENTS 59-208790  11/1984  Japan .

*Primary Examiner*—Alan Diamond
*Attorney, Agent, or Firm*—Gifford, Krass, Groh, Sprinkle, Anderson & Citkowski, P.C.

[57] ABSTRACT

A large area photovoltaic device includes a plurality of photovoltaic regions electrically interconnected in parallel. The regions are defined by a plurality of conductive channels which establish electrical contact between a top transparent electrode of the device and a monolithic, metal substrate electrode. A second terminal of the device is provided by a bottom, metallic electrode disposed beneath the semiconductor body, and upon an electrically insulating layer which is supported upon the metallic substrate.

21 Claims, 3 Drawing Sheets

POINT CONTACT PHOTOVOLTAIC MODULE AND METHOD FOR ITS MANUFACTURE

FIELD OF THE INVENTION

This invention relates generally to semiconductor devices and more particularly to photovoltaic devices. Most specifically, this invention relates to large area photovoltaic devices comprised of a number of photovoltaic generating regions, disposed on a common, electrically conductive substrate and interconnected in a parallel relationship by high conductivity channels.

BACKGROUND OF THE INVENTION

Photovoltaic devices provide a non-polluting, solid and reliable source of electrical power. Originally, photovoltaic devices were fabricated from crystalline materials, and as a consequence, were expensive and restricted in size. Techniques have now been developed for the preparation of large area, thin films of semiconductor material which may be advantageously fabricated into low cost, large area, light weight photovoltaic devices.

It is frequently desirable to subdivide large area photovoltaic devices into a plurality of electrically interconnected small area devices which are disposed upon a common substrate. The structure of these arrays makes them more tolerant of defects in the photovoltaic material, and allows for the selection of desired voltage and/or current outputs. In some instances, the small area devices of an array are interconnected in a series arrangement so as to provide for an increased voltage. In other instances, particularly for low voltage, high current applications, a parallel connected array is desired. A parallel connected array provides a constant voltage which is independent of device area. While a single, large area body of photovoltaic material will provide a high current at a low voltage, it is often desirable to configure such large area material into an array of small area devices interconnected in a parallel relationship. Such a parallel connected array allows for localization of defective regions in the photovoltaic material so that such defects may be readily removed without adverse effect on the remainder of the device.

Photovoltaic devices, and particularly thin film photovoltaic devices usually include a transparent, electrically conductive top electrode for collecting photo generated current therefrom. The transparent, electrically conductive electrode material is usually of relatively modest electrical conductivity; therefore, large area devices require current carrying structures such as gridlines, bus bars and the like for decreasing their series resistance. These current carrying structures are fabricated from metals or other such opaque materials, and their presence upon the light incident surface of the photovoltaic device represents a loss of active area. Furthermore, subdividing large area material into a plurality of smaller area devices involves scribing away portions of the semiconductor material, and the scribed regions also represent photovoltaically inactive areas. Clearly, it is desirable to maximize the active area of photovoltaic devices by limiting the size of such inactive areas, while still maintaining low series resistivity in the device.

Various approaches have been implemented in the prior art for manufacture of photovoltaic devices which include a plurality of electrically interconnected small area devices disposed upon a single substrate and having a maximized active area. U.S. Pat. No. 5,268,037 describes a large area photovoltaic array preferably fabricated by a laser scribing process. The array is defined by a plurality of finely scribed lines which subdivide a large area body of photovoltaic material into a series of discrete photovoltaic devices which are electrically connected in parallel and in which current carrying structures are disposed beneath the active semiconductor layer. U.S. Pat. No. 5,468,988 discloses a large area photovoltaic device comprised of a plurality of photovoltaic regions electrically interconnected in parallel. In this device, electrical interconnection is accomplished by means of a large number of relatively small through hole connections which pass through the active semiconductor layer of the device and establish electrical communication between the top and bottom surfaces thereof. The device of the 5,468,988 patent provides a photovoltaic device having a high percentage of photovoltaically active area; however, its manufacture requires that two sets of relatively small through holes be defined in the device at two separate stages of its fabrication, and that these two sets of holes be in a concentric relationship. Vacuum deposition of the top, transparent conductive electrode layer of the device takes place after formation of the second set of holes, which requires introduction and reintroduction of a substrate into a vacuum deposition chamber to complete device fabrication.

It would be desirable to manufacture a large area photovoltaic array by a process which minimizes the number of hole forming steps employed and which also minimizes the number of times a deposition substrate must be placed into, and taken out of a vacuum deposition chamber. In accord with the present invention, and as will be explained in detail hereinbelow, it has been found that in the fabrication of a large area photovoltaic array, conductive paths through the photovoltaic material may be formed by selective heating of the material, and the use of such paths eliminates the step of forming one of the sets of holes thereby eliminating the need for two separate vacuum deposition steps. These and other advantages of the present invention will be apparent from the drawings, discussion and description which follow.

BRIEF DESCRIPTION OF THE INVENTION

There is disclosed herein a large area photovoltaic device. The device includes a metallic substrate having a layer of electrically insulating material disposed thereupon. An electrically conductive, bottom electrode layer is disposed upon the insulating layer, and a plurality of holes are defined in the bottom electrode layer and the insulating layer such that each hole passes through the bottom electrode layer and the insulating layer so as to expose an edge portion of the bottom electrode layer and a contact portion of the substrate, which is free of the insulating layer, in each hole. A semiconductor body is disposed atop the back electrode layer, and the semiconductor body at least partially fills the holes so as to cover the edge portions of the bottom electrode layer in each of the holes. The photovoltaic device further includes a plurality of high electrical conductivity channels, each channel having an electrical resistivity which is lower than the electrical resistivity of the semiconductor body. Each channel extends through the semiconductor body from a top surface thereof to a bottom surface thereof, and each channel is disposed so as to pass through a respective one of the holes so as to establish electrical contact with the respective contact portion of the substrate exposed in each hole. Each channel is also separated from the edge portion of the back electrode layer defined by its respective hole, by a portion of the semiconductor body. The device further includes a layer of a transparent, electrically conductive material disposed upon the top surface of the semiconductor body, in electrical communication with the channels. In the device, the channels define a plurality of low resistivity paths through the semiconductor body, extending between the layer of transparent electrically conductive material and the substrate.

In particular embodiments, the holes have a diameter in the range of 25 to 125 microns, and are spaced apart by a distance of approximately 1–5 millimeters. The device may also include a first electrical terminal in electrical communication with the substrate member and a second electrical terminal in communication with the bottom electrode, and these terminals function for establishing electrical contact with the device. Preferably the device will also include an encapsulant layer of a transparent, protective material atop the transparent conductive layer.

In one embodiment, the channels comprise a portion of the semiconductor body which has been heated to a temperature in excess of its melting point so as to convert the semiconductor body to a high conductivity material. In a specific embodiment of the invention, the semiconductor body includes at least one layer of a hydrogenated group IV semiconductor alloy material.

The present invention also includes a method for the manufacture of the device, and in one particular method, the high conductivity channels are formed through the semiconductor body, by irradiating the body with a high intensity beam of light, as for example from a laser. This step of channel formation may be implemented either before or after the transparent conductive material is disposed upon the semiconductor body.

DETAILED DESCRIPTION OF THE INVENTION

The present invention relates to a large area photovoltaic device having a plurality of photovoltaically active regions which are electrically interconnected in a parallel relationship by a number of high conductivity channels passing through the thickness of the device. As will be detailed hereinbelow, the particular configuration of this device avoids the need for disposing current carrying structures such as grid lines, bus bars and the like on the light incident surface of the device.

Figure 1:
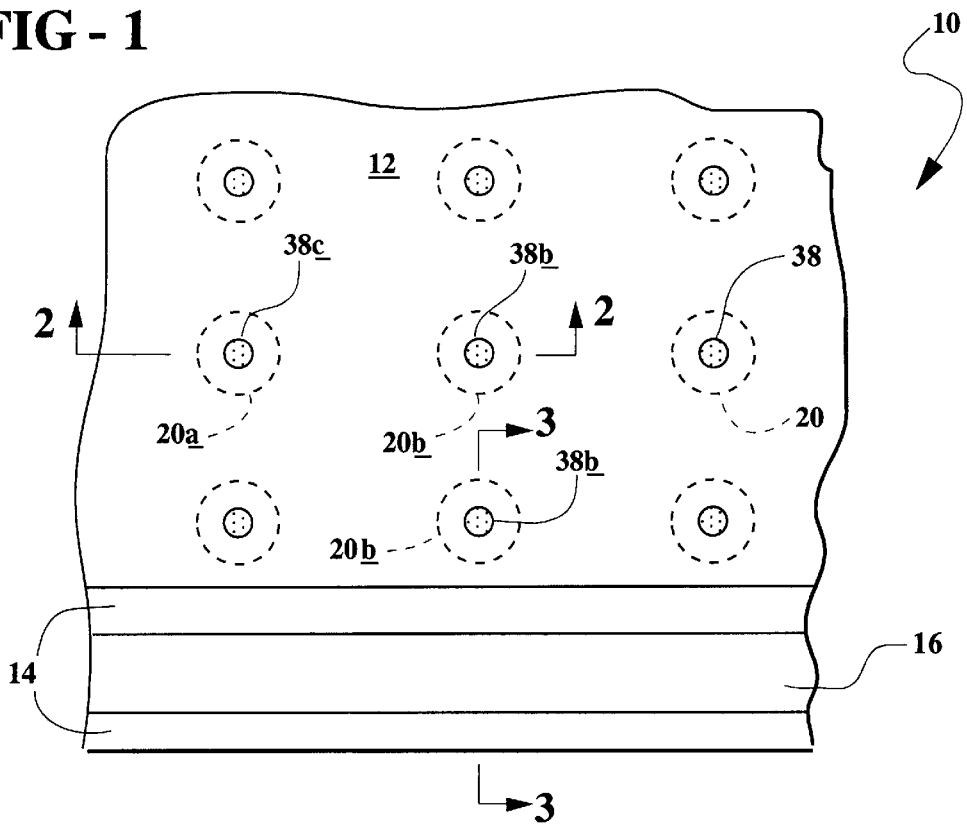
FIG. 1 is a top, plan view of a portion of a large area photovoltaic device structured in accord with the principles of the present invention.

Referring now to FIG. 1, there is shown a top plan view of a portion of a large area photovoltaic device 10 structured in accord with the principles of the present invention. The device 10 includes a photovoltaically active region 12, as well as an edge portion 14 which is photovoltaically inactive and which includes a current carrying bus bar 16 thereupon. The photovoltaically active region 12 includes a plurality of superposed layers of material, as will be described in further detail hereinbelow. A series of high conductivity channels 38 pass through the device 10, and each channel 38 is generally concentric with a hole 20 defined through various of the lower layers of the device; and, in FIG. 1, these holes 20 are indicated by phantom outlines.

Figure 2:
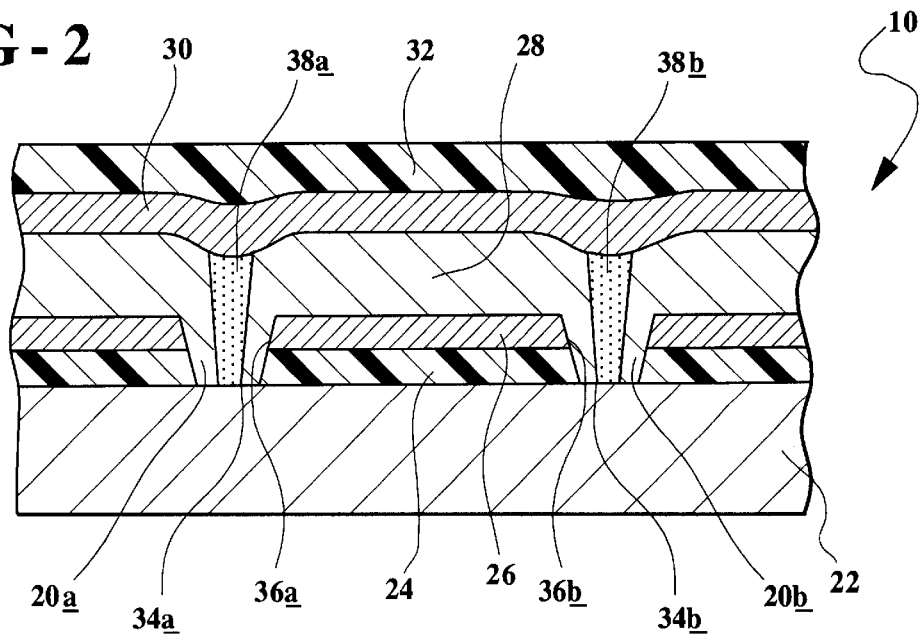
FIG. 2 is a cross sectional view of the device of FIG. 1 taken along line 2—2.

Referring now to FIG. 2, there is shown a cross sectional view of the device 10 of FIG. 1 taken along lines 2–2. The device 10 includes an electrically conductive substrate 22. In accord with the present invention, the substrate is most preferably a monolithic metal substrate member, with said term being defined to include a substrate which is relatively thick in cross section compared to overlying layers. It is to be understood that the substrate of the present invention may also include a body of metal supported, or coated, upon a layer of another material such as glass, ceramic or the like. The substrate of the present invention forms one current collecting electrode of the device 10 and is in electrical communication with the overlying layers of the device.

In one preferred embodiment, the substrate 22 is at least 50, and typically 100 times thicker than any of the overlying individual semiconductor or electrode layers of the device. The substrate 22 is a generally self supporting member typically fabricated from sheet metal having a thickness of at least 1 mil. In contrast, the overlying layers have a total thickness which is usually no more than several microns; although for clarity of illustration, the thickness of the layers has been exaggerated in these Figures. While the substrate 22 has no upper limit on thickness, in the interest of material economy, ease of handling and maintenance of flexibility, it will most generally be preferred that the substrate 22 be less than 1 millimeter in thickness and most preferably have a thickness in the range of 3–10 mils. The substrate 22 may be fabricated from any electrically conductive metal and is most preferably fabricated from stainless steel, brass, copper, aluminum or any other such low cost metal having good electrical conductivity. In some instances, the substrate 22 may further include a backing or support layer and all such substrates are encompassed within the definition of monolithic substrates in accord with the present disclosure.

Disposed upon the substrate 22 is an electrically insulating layer 24. The insulating layer 24 may be formed from an organic polymeric material such as polyimide, and one particular polyimide having utility in the present invention is a material sold under the name Kapton® by the Dow Chemical Company. The insulating layer 24 may be also formed from an inorganic material such as an oxide of silicon, silicon nitride, aluminum oxide, or like materials taken either singly or in combination. In some particular instances, the insulating layer 24 may be derived from the substrate 22 by a process of oxidation, nitriding, or the like. In one particularly preferred process, the insulating layer 24 is deposited by a microwave energized chemical vapor deposition process, although it is to be understood that other vacuum deposition processes such as evaporation, sputtering, and the like may be similarly employed.

Disposed upon the insulating layer 24 is an electrically conductive, bottom electrode layer 26. The bottom electrode layer 26 is typically fabricated from a metallic material, preferably a material having good electrical conductivity. In one particularly preferred embodiment, the bottom electrode layer is fabricated from a highly reflective metal which enhances the efficiency of the photovoltaic device by directing non-absorbed light back through the overlying photovoltaic body to increase light absorption. As is well known in the art, the reflective surface of the layer 26 may be texturized so as to increase the light scattering therefrom. The bottom electrode layer 26 may be fabricated from a highly reflective metal such as silver or copper, or it may be a composite body fabricated from a layer of less reflective metal covered with a layer of silver or copper. In some instances, the bottom electrode layer may include a protective and/or texturizing layer fabricated from transparent, electrically conductive materials, and within the context of this disclosure, the bottom electrode layer 26 shall be defined to include any layer, or collection of layers, which are disposed upon the insulating layer 24 and provide one of the electrodes of the photovoltaic device.

Disposed atop the bottom electrode layer 26 is a photovoltaic body 28. The photovoltaic body 28 operates to absorb incident photons and generate an electrical current in response thereto. The photovoltaic body 28 may comprise any one of a number of photovoltaic materials such as silicon, silicon alloys, gallium arsenide, $CuInSe_2$ CdS among others. One particularly preferred photovoltaic material comprises hydrogenated, thin film alloys of silicon and/or silicon-germanium. These materials may be fabricated into P-I-N photovoltaic devices wherein a layer of substantially intrinsic alloy material is interposed between oppositely doped semiconductor layers. In some instances a plurality of P-I-N triads may be stacked atop one another to provide increased photovoltaic conversion efficiency. Within the context of this disclosure, the term photovoltaic body, shall include any layer or aggregation of layers of semiconductor material which generates a flow of electrical current in response to the absorption of illumination thereby.

The device 10 further includes a transparent, electrically conductive layer 30 which forms a top electrode of the photovoltaic device. The transparent electrically conductive layer 30 is most preferably a layer of a transparent, electrically conductive metal oxide (TCO) such as indium oxide, tin oxide, zinc oxide, cadmium oxide, or combinations thereof.

It will also be noted that the device includes a top encapsulant body 32. This body is electrically insulating and optically transparent and serves to protect underlying portions of the device from ambient atmospheric conditions. It is to be understood that the encapsulant 32 is optional, and in some instances may be omitted. The encapsulant body 32 may comprise one or more layers of an organic polymeric material, and one particularly preferred group of materials comprises fluoropolymers. In other instances, the protective layer may comprise one or more layers of inorganic material such as an oxide of silicon, silicon nitride, silicon carbide, boron carbide and the like. All of the foregoing layers may be taken either singly or in combination. It has been found that inorganic layers as described hereinabove, when employed at a thickness of ten microns or greater provide a very good barrier to water penetration.

The device 10, as shown in FIG. 2, includes two holes 20a, 20b which are defined through the bottom electrode layer 26 and the insulating layer 24. Each of these holes 20 passes completely through the back electrode layer 26 and insulating layer 24 so as to expose a contact portion of the substrate 34a, 34b, respectively, therein. The holes 20a, 20b also expose an edge portion 36a, 36b respectively, of the back electrode layer 26.

The semiconductor body 28 is disposed so as to at least partially fill the holes 20 so that th e edge portions 36 of bottom electrode layer 26 exposed in each of the holes 20 is covered by the semiconductor body 28. As is further shown in FIG. 2, the device also includes a number of high electrical conductivity channels 38. Each of the channels, for example channels 38a, 38b are associated with a respective one of the holes 20a, 20b and establish a high conductivity current path extending from the transparent electrically conductive layer 30, through the semiconductor body 28, to the respective contact regions 34a, 34b, of the substrate 22. The high conductivity channels 38 preferably have an electrical resistivity which is at least two orders of magnitude lower than the electrical resistivity of the semiconductor 28. In one preferred embodiment of the present invention, the channels 38 are formed through the semiconductor body 28, by heating the semiconductor 28 to an elevated temperature which is sufficient to lower its electrical resistivity. Heating is most preferably accomplished by a laser beam, although, an electron beam may be similarly employed. In one embodiment of the invention, the semiconductor body 28 includes at least one layer of a material which is amorphous, microcrystalline, nanocrystalline, or otherwise lacking in long range order, and it is speculated that the heating of this material converts it to an at least partially crystallized material having higher conductivity. Also, in most instances, the channels 38 are created after the deposition of the transparent conductive electrode layer 30, and it is also possible that the heating step brings about some interaction between the transparent conductive layer 30 and the semiconductor body 28, which significantly lowers the electrical resistivity of the semiconductor layer. In any event, it has been noted that heating of the semiconductor layer brings about a significant change in the electrical conductivity of the layer, and this change creates the high conductivity channels 38. It is also notable that the channels 38 are separated from the exposed edges 36 of the back electrode layer 26 by a portion of the relatively high resistivity semiconductor body 28.

It will thus be seen that the configuration of the device 10 of FIG. 2 provides plurality of photovoltaically active regions, each of which comprises a portion of the semiconductor body 28 and together with overlying portions of the top, transparent conductive electrode layer 38 and the overlying portions of the bottom electrode layer 26. The semiconductor body 28 functions to absorb incident photons, and generate electron-hole pairs in response thereto. These carriers are collected by the top, transparent conductive electrode 30 and the bottom electrode 26. Those carriers which are collected by the top electrode 30 travel laterally through the modest conductivity, transparent conductive electrode 30 to the closest high conductivity channel 38, which carries them to the high conductivity substrate electrode 22. Short circuiting of the device between the channel 38 and back electrode 26 is prevented because of the fairly high electrical resistivity of the semiconductor body 28 which separates the channel 38 from edge portions 36 of the bottom electrode 26.

Since the transparent conductive electrode layer 30 has a relatively high electrical resistivity, the prior art typically required the presence of current collecting grid lines thereupon in order to minimize the series resistivity of a photovoltaic device. By the use of the present invention, the series of relatively narrow channels 38, passing through the device provide for current collection by a relatively thick, highly conductive substrate electrode 22, thereby minimizing series resistivity of the device, and maximizing its photovoltaically active area. In a typical device, the channels are spaced approximately 1–5 millimeters apart, hence photocurrent will never have to travel more than 0.5–2.5 millimeters through the transparent conductive electrode layer 30 to reach the high conductivity substrate 22.

Figure 3:
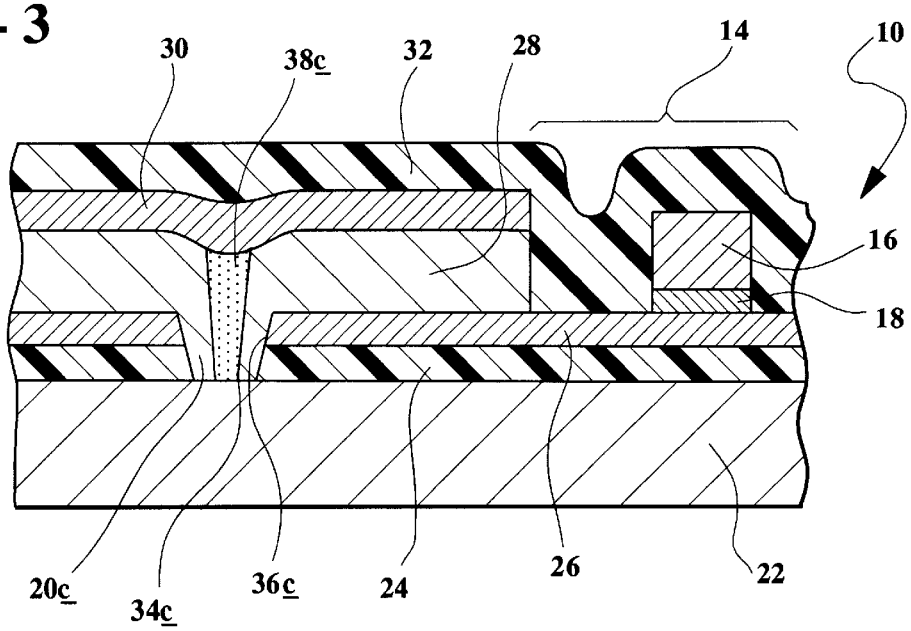
FIG. 3 is a cross sectional view of the device of FIG. 1 taken along line 3—3.

Referring now to FIG. 3, there is shown a cross sectional view of the device 10 of FIG. 1 taken along lines 3—3. FIG. 3 shows the substrate 22, the insulating layer 24, the back electrode layer 26, the semiconductor layer 28, the top, transparent, electrically conductive electrode layer 30, and the encapsulant layer 32 of the device. FIG. 3 also illustrates one of the holes 20c and its respective channel 38c. FIG. 3 further shows the edge portion 14 of the device, and this edge portion 14 does not include any photovoltaic body; although, the substrate 22, insulating layer 24 and back electrode layer 26 comprise this portion of the device. The edge portion 14 also includes an electrically conductive bus bar 16 which is fixed to the bottom electrode layer 26, in electrical communication, by means of an electrically conductive material 18, such as a body of solder or electrically conductive adhesive. As will be seen from FIG. 3, the body of encapsulant material 32 extends over the edge portion 14 and covers the bus bars 16. In the operation of the device, the bus bar 16, which is preferably formed from a high conductivity copper tape or wire, and the substrate 22 form the two terminals of the large area photovoltaic device, and as is known in the art, they may be provided with appropriate connectors and the like to allow the device to be integrated into a power system.

Figure 4:
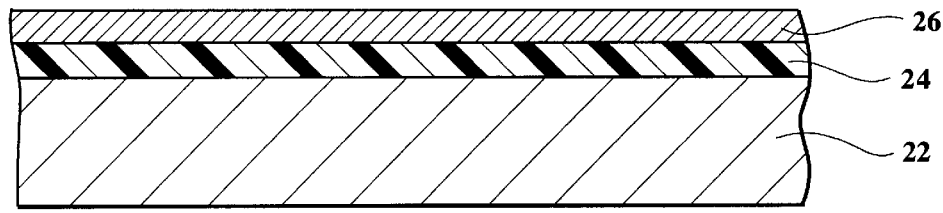
FIGS. 4–8 are cross sectional views of a device structured in accord with the principles of the present invention, at various stages of its fabrication.

Referring now to FIGS. 4–8, there are shown steps in the fabrication of a photovoltaic device generally similar to that of FIGS. 1–3, and similar structures will be indicated by like reference numerals. As shown in FIG. 4, a monolithic, electrically conductive, metallic substrate 22 has an insulating layer 24 applied thereto. The insulating layer 24 may comprise a separate body of a material such as a body of polymeric or inorganic material applied by conventional techniques such as solvent coating, sputtering, evaporation and the like, or it may comprise a body of material derived from the treatment of the substrate 22 as for example by anodizing, nitriding or the like. As further shown in FIG. 4, a layer of electrically conductive bottom electrode material 26 is deposited atop the layer of insulating material 24. The bottom electrode layer 26 is preferably a layer of metal and may be deposited by conventional techniques such as evaporating, sputtering, plating, or thermal decomposition of metallic compounds. As noted hereinabove, the bottom electrode layer 26 may comprise a single layer or a plurality of layers.

Figure 5:
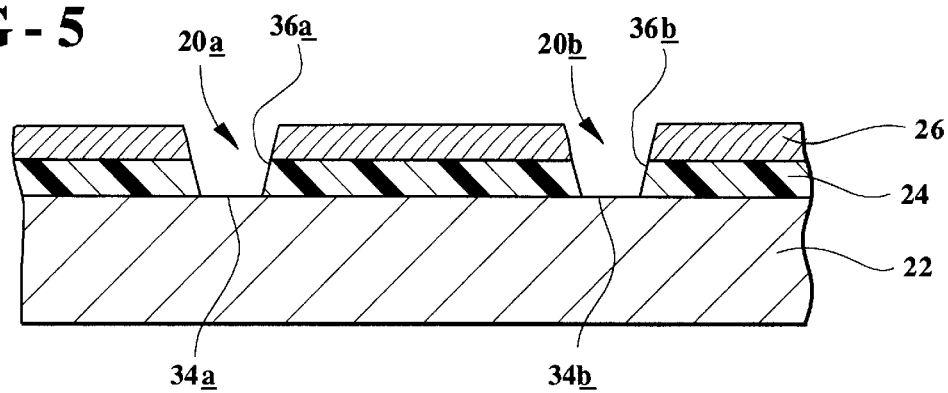
Figure 6:
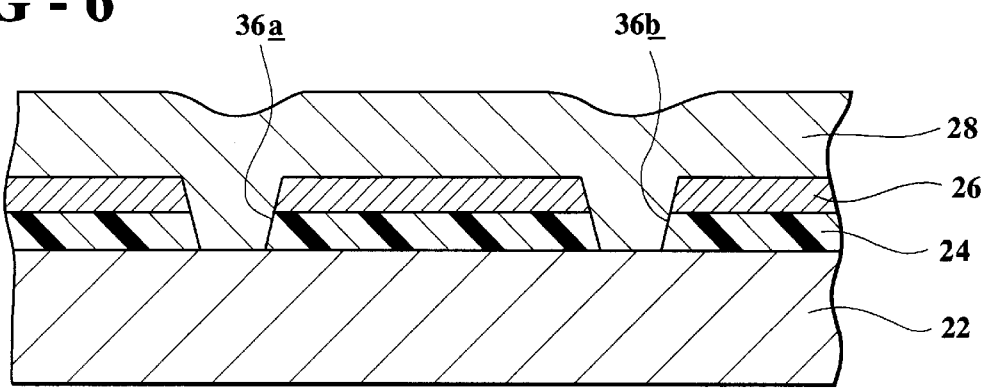

As shown in FIG. 5, a plurality of holes, for example holes 20a and 20b are defined through the insulating layer 24 and bottom electrode layer 26. Each hole passes completely through both layers so as to expose a portion of the top surface of the substrate 22, referred to herein as a contact portion 34a, 34b at the bottom of the hole. The hole also exposes an edge portion 36a, 36b of the bottom electrode layer 26. As shown in FIG. 5, the contact portions 34a, 34b of the substrate exposed in the holes 20a, 20b are shown as being flat portions; however, it is to be understood that the hole forming technique may actually remove a portion of the substrate 22 so that the contact portion 34 may comprise a non-planar surface.

The holes are most preferably formed by use of a laser, and one particularly preferred laser comprises a NdYAG laser operating at a wavelength of approximately 1.06 micron; although it is to be understood that other lasers such as $CO_2$ lasers, argon ion lasers and the like may be similarly employed. Alternatively, the holes may be formed by ion milling, chemical etching or similar techniques. There is no practical limit on the size of the holes. However, in order to maximize the photovoltaically active area of the device, and to minimize the series resistivity of the device, the diameter of the holes 20 is preferably in the range of 20–100 microns, with 50 microns being one particularly preferred diameter.

In the next step of the fabrication of the device, a body of semiconductor material 28 is disposed atop the bottom electrode layer 26 so as to at least partially fill the holes 20 and to cover the exposed edges 36 of the back electrode layer 26. As noted above, the semiconductor body 28 may comprise a plurality of variously doped semiconductor layers, and in one preferred embodiment, includes at least one triad of N-I-P configuration comprised of hydrogenated silicon and/or silicon-germanium alloy materials.

Figure 7:
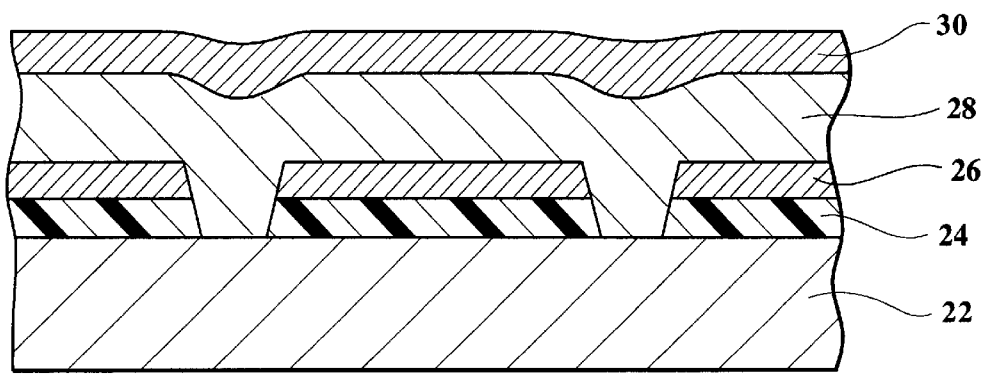

In the next process step, as shown in FIG. 7, a top layer of transparent conductive electrode material 30 is deposited atop the entire area of the device so as to cover the top surface of the semiconductor body 28. At this point, the process of the present invention differs significantly from prior art processes of the type shown in U.S. Pat. No. 5,468,988, since such previously employed processes require that a second hole be formed though the semiconductor body, concentric with the first hole, prior to the deposition of the top transparent conductive electrode layer. As is known in the art, the transparent conductive electrode layer 30 may be deposited by various vacuum deposition techniques such as sputtering or evaporation.

In the next step of the method of the present invention, high conductivity channels 38a, 38b are formed in the semiconductor body so as to establish electrical communication between the top, transparent conductive electrode layer 30 and the substrate electrode 22. As previously described, these channels 38 may be formed by heating the semiconductor body, typically to a temperature above its melting or crystallization point, and such heating is most advantageously accomplished through the use of a laser. Typically the laser is the same laser which was used for the formation of the holes; however, it is operated at a lower power density. The specific power density employed will depend upon the composition and thickness of the semiconductor body 28, and to some degree the composition and thickness of the top, transparent conductive electrode layer 30. The diameter of the channels 38 is selected to be less than the diameter of the holes 28 so that the channel 38 does not contact the exposed edge 36 of the back electrode layer 26, so as to avoid short circuits.

Figure 8:
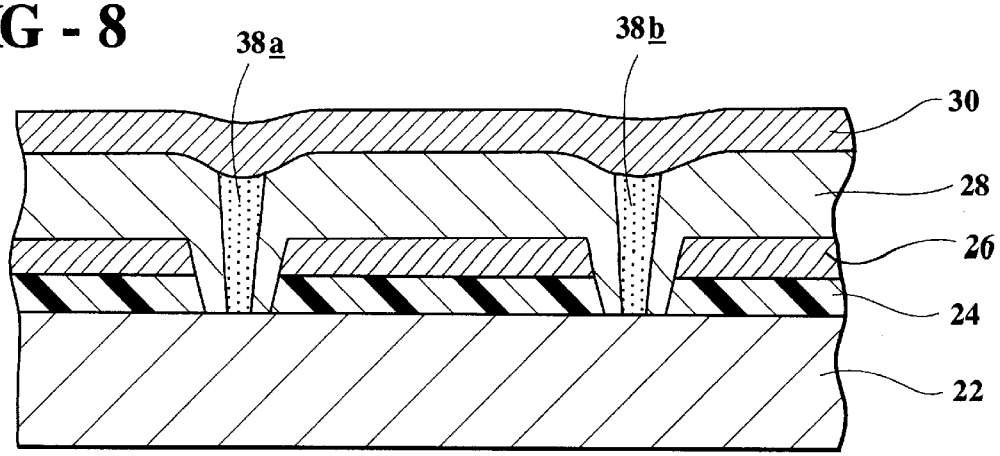

As specifically shown in FIGS. 7 and 8, channel formation takes place after the deposition of the top, transparent conductive electrode layer 30; however, in some embodiments of the present invention, channel formation may take place prior to the deposition of this layer. Also, and as was explained hereinabove, a top protective layer of encapsulant material, such as the layer 32 shown in FIGS. 2 and 3 is generally disposed upon the top, transparent conductive electrode 30. This layer is most generally applied to the device after channel formation so as to avoid interference with the channel formation process.

The spacing of the holes and associated channels will depend upon a balance of the resistivity of the top conductive electrode, the size of the holes and the electrical characteristics of the device. Resistivity loss for the top surface of a device generally similar to that shown herein may be calculated by the following formula.

$$I^2 R = \frac{\pi}{2} \rho_\Box J^2 \left[ r_d^4 \ln\left(\frac{r_d}{r_o}\right) + \frac{r_d^4}{4} - \frac{r_o^4}{4} - r_d^4 + r_d^2 r_o^2 \right]$$

Wherein $\rho_\Box$ is the sheet resistance of the transparent conductive electrode, J is the current density of the cell, $r_d$ is one half of the spacing between holes and $r_o$ is the radius of the hole.

Similarly, the resistivity of the bottom electrode will also determine the efficiency of the device since all photo generated current must pass through this electrode. It has been found that the resistive loss for the back electrode may be calculated by the formula.

$$I^2 R = \rho_\Box J^2 w \frac{L^3}{3}$$

Wherein $\rho_\Box$ is the sheet resistance of the bottom electrode, J is the current density of the cell, W is the width of the cell and L isits length.

By utilizing the above referenced equations, the layer thickness and hole spacing may be optimized. In general, the hole spacing will be in the approximate range of 0.5 to 10 millimeters, and more preferably 1 to 5 millimeters.

The present invention utilized to produce very large area semiconductor devices comprises of active regions interconnected in parallel. By so configuring the photovoltaic material, current is effectively collected without the need for placing opaque structures atop the device thereby optimizing the active area. Furthermore, the configuration of the device permits ready removal of a defective region by scribing, etching or any other such removal process. The invention calls for the production of highly efficient, relatively low voltage, high amperage photovoltaic devices. Such devices may be utilized for water electrolys is or other such electrochemical processes or they may be interconnected in series to provide high voltage, high amperage power generators.

It is to be understood that the present invention may be practiced with a variety of semiconductor and electrode materials, and while one particular configuration of device has been described, the techniques of the present invention may be incorporated into the fabrication of a variety of other devices. In view of the foregoing, it is clear that the invention may be practiced in a variety of configurations and employing a number of steps different from those depicted and described herein. All of such variations and modifications are within the scope of the present invention. The foregoing drawings, discussion and descriptions are meant to be illustrative of particular embodiments of the invention and are not meant to be limitations upon the practice thereof. It is the following claims, including all equivalents, which define the scope of the invention.

We claims:

1. A large area photovoltaic device comprising:

a metallic substrate;

an electrically insulating layer disposed on said substrate;

an electrically conductive, bottom electrode layer disposed upon said insulating layer;

a plurality of holes defined in said bottom electrode layer and said insulating layer, each hole passing through said bottom electrode layer and said insulating layer so that an edge portion of said bottom electrode layer and a contact portion of said substrate, which is free of said insulating layer, are exposed in each hole;

a semiconductor body which is disposed atop said back electrode layer, said semiconductor body at least partially filling said holes so as to cover the respective edge portions of said bottom electrode layer which are exposed in each of said holes, said semiconductor body having a first electrical resistivity;

a plurality of high electrical conductivity channels, each channel consisting essentially of a portion of the semiconductor body which has been heated to a temperature in excess of its melting point, and having an electrical resistivity which is lower than the electrical resistivity of said semiconductor body, and each channel extending through said semiconductor body from a top surface thereof to a bottom surface thereof, each channel being disposed so as to pass through a respective one of said holes so as to establish electrical contact with the respective contact portion of said substrate exposed in said hole, and each channel being separated from the edge portion of the back electrode layer defined by its respective hole, by said semiconductor body; and a layer of a transparent, electrically conductive material disposed upon the top surface of the semiconductor body, in electrical communication with said channels; wherein said channels define a plurality of low resistivity paths through the semiconductor body, extending between said layer of transparent, electrically conductive material and said substrate.

2. A photovoltaic device as in claim 1, wherein said holes are spaced apart by a distance in the range of 1–5 mm.

3. A photovoltaic device as in claim 1, wherein said holes have a diameter in the range of 25–125 microns.

4. A photovoltaic device as in claim 1, wherein said substrate has a thickness in the range of 3–10 mils.

5. A photovoltaic device as in claim 1, further including a first electrical terminal in electrical communication with said substrate member and a second electrical terminal in communication with said bottom electrode.

6. A photovoltaic device as in claim 1, further including an encapsulant layer disposed atop said transparent conductive layer.

7. A photovoltaic device as in claim 1, wherein said semiconductor body includes a triad comprised of a layer of substantially intrinsic semiconductor material interposed between oppositely doped layers of semiconductor material.

8. A photovoltaic device as in claim 7, wherein said semiconductor body comprises at least two of said triads disposed in a stacked relationship.

9. A photovoltaic device as in claim 1, wherein said semiconductor body includes at least one layer of a hydrogenated Group IV semiconductor alloy material.

10. A photovoltaic device as in claim 1, wherein the electrical resistivity of said semiconductor body is at least of two orders of magnitude greater than the electrical resistivity of said channels.

11. A photovoltaic device as in claim 1, wherein said insulating layer comprises a layer of inorganic material.

12. A photovoltaic device as in claim 11, wherein said inorganic material is selected from the group consisting of silicon dioxide, silicon nitride, aluminum oxide, and combinations thereof.

13. A photovoltaic device as in claim 1, wherein said insulating layer comprises a layer of an organic material.

14. A photovoltaic device as in claim 1, wherein said layer of bottom electrode material comprises a layer having a light reflective surface.

15. A photovoltaic device as in claim 14, wherein said light reflective surface is a textured surface.

16. A method for manufacturing a large area photovoltaic device, said method comprising the steps of:

providing a metallic substrate;

disposing a layer of an electrically insulating material on said substrate;

disposing a layer of an electrically conductive, bottom electrode material upon said insulating layer;

defining a plurality of holes in said bottom electrode layer and said insulating layer, each hole passing through said bottom electrode layer and said insulating layer so that an edge portion of said bottom electrode layer and a contact portion of said substrate, which is free of said insulating layer, are exposed in each hole;

disposing a semiconductor body atop said back electrode layer so that said semiconductor body at least partially fills said holes so as to cover the respective edge portions of said bottom electrode layer which are exposed in each of said holes, said semiconductor body having a first electrical resistivity;

forming a plurality of high electrical conductivity channels in said semiconductor body, each channel consisting essentially of a portion of the semiconductor body which has been heated to a temperature in excess of its melting point and having an electrical resistivity which is lower than the electrical resistivity of said semiconductor body, and each channel extending through said semiconductor body from a top surface thereof to a bottom surface thereof, each channel being disposed so as to pass through a respective one of said holes so as to establish electrical contact with the respective contact portion of said substrate exposed in said hole, each channel being formed so as to be separated from the edge portion of the back electrode layer defined by its respective hole, by said semiconductor body; and disposing a layer of a transparent, electrically conductive material upon the top surface of the semiconductor body, in electrical communication with the channels; whereby said channels define a plurality of low resistivity paths through the semiconductor body, extending between said layer of transparent electrically conductive material and said substrate.

17. A method as in claim 16, wherein the step of forming said plurality of channels comprises directing a beam of light on to regions of the semiconductor body corresponding to said channels, said beam of light having an intensity and a duration sufficient to lower the electrical resistivity of said semiconductor body by at least two orders of magnitude.

18. A method as in claim 17, wherein the step of directing said beam of light comprises generating a coherent bean of light with a laser, and directing said coherent beam of light.

19. A method as in claim 18, wherein said laser is a Nd YAG laser and said coherent beam of light has a wave length of 1.06 nm.

20. A method as in claim 16, wherein said plurality of channels are formed after the layer of transparent electrically conductive material is disposed upon the top surface of the semiconductor body.

21. A method as in claim 16, including the further step of disposing a layer of encapsulant material atop the transparent electrically conductive material.

* * * * *